United States Patent
Kang

(10) Patent No.: US 12,330,879 B2
(45) Date of Patent: Jun. 17, 2025

(54) TRANSPORT APPARATUS

(71) Applicant: SEMES CO., LTD., Cheonan-si (KR)

(72) Inventor: Okkyung Kang, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 97 days.

(21) Appl. No.: 18/220,675

(22) Filed: Jul. 11, 2023

(65) Prior Publication Data

US 2024/0017928 A1 Jan. 18, 2024

(30) Foreign Application Priority Data

Jul. 18, 2022 (KR) .................. 10-2022-0088462

(51) Int. Cl.
*B65G 17/12* (2006.01)

(52) U.S. Cl.
CPC .................... *B65G 17/12* (2013.01)

(58) Field of Classification Search
CPC . B65G 17/12; B65G 47/907; H01L 21/67736; H01L 21/67733; H01L 21/6773; H01L 21/67706; B66C 11/04; B66C 1/62; B66C 13/04; B66C 13/14; B66C 15/00
See application file for complete search history.

(56) References Cited

U.S. PATENT DOCUMENTS

| | | | |
|---|---|---|---|
| 9,230,844 B2 | 1/2016 | Mizokawa et al. | |
| 10,196,214 B2 * | 2/2019 | Motoori | B61K 1/02 |
| 2013/0230375 A1 * | 9/2013 | Tung | H01L 21/67733 |
| | | | 414/592 |

FOREIGN PATENT DOCUMENTS

| | | | | |
|---|---|---|---|---|
| JP | 2005022539 A | * | 1/2005 | |
| KR | 2010096682 A | * | 9/2010 | ........... B65G 1/0407 |
| KR | 10-2017-0087523 A | | 7/2017 | |
| KR | 10-2021-0019789 A1 | | 2/2021 | |
| KR | 2021019789 A | * | 2/2021 | |
| KR | 10-2022-0091112 A | | 6/2022 | |
| TW | 1411568 B | * | 10/2013 | |
| TW | I411568 B | * | 10/2013 | |
| WO | WO-2018146926 A1 | * | 8/2018 | ............. B60L 15/38 |

OTHER PUBLICATIONS

Notice Of Allowance dated Aug. 14, 2024 for corresponding KR Patent Application No. 10-2022-0088462.
Office Action dated Feb. 2, 2024 for corresponding KR Patent Application No. 10-2022-0088462.

* cited by examiner

*Primary Examiner* — Gene O Crawford
*Assistant Examiner* — Abby A Jorgensen
(74) *Attorney, Agent, or Firm* — Muir Patent Law, PLLC

(57) ABSTRACT

A transport apparatus includes a transport vehicle configured to move along a traveling rail and including a transport vehicle body, and a hoist apparatus coupled to the transport vehicle, wherein the hoist apparatus includes a first hoist apparatus coupled to the transport vehicle body, and capable of clutching a first carrier and hoisting and lowering the first carrier in upward and downward directions, and a second hoist apparatus coupled to the transport vehicle body and apart from the first hoist apparatus, and capable of clutching a second carrier and hoisting and lowering the second carrier in upward and downward directions.

11 Claims, 17 Drawing Sheets

TRANSPORT APPARATUS

CROSS-REFERENCE TO RELATED APPLICATION

This application is based on and claims priority under 35 U.S.C. § 119 to Korean Patent Application No. 10-2022-0088462, filed on Jul. 18, 2022, in the Korean Intellectual Property Office, the disclosure of which is incorporated by reference herein in its entirety.

BACKGROUND

1. Field

The disclosure relates to a transport apparatus, and more particularly, to a transport apparatus including a transport vehicle for transporting a carrier having mounted thereon materials for manufacturing a semiconductor device.

2. Description of the Related Art

In a semiconductor manufacturing plant, carriers having mounted thereon materials for manufacturing semiconductor devices, for example, wafers and masks, may be transported via transport apparatuses, such as overhead hoist transport (OHT) apparatuses. OHT apparatuses may be transport apparatuses for transporting carriers via transport vehicles configured to be movable along traveling rails installed on the ceilings of clean rooms. The transport vehicles disposed on the traveling rails may move along the traveling rails and transport the carriers from some locations on the traveling rails to other locations.

SUMMARY

Provided is a transport apparatus including a transport vehicle capable of transporting a larger number of carriers.

Additional aspects will be set forth in part in the description which follows and, in part, will be apparent from the description, or may be learned by practice of the presented embodiments of the disclosure.

According to an aspect of the disclosure, a transport apparatus includes a transport vehicle configured to move along a traveling rail, and including a transport vehicle body, and a hoist apparatus coupled to the transport vehicle.

The hoist apparatus includes a first hoist apparatus coupled to the transport vehicle body, and capable of clutching a first carrier and hoisting and lowering the first carrier in upward and downward directions, and a second hoist apparatus coupled to the transport vehicle body and apart from the first hoist apparatus, and capable of clutching a second carrier and hoisting and lowering the second carrier in upward and downward directions.

According to another aspect of the disclosure, a transport apparatus includes a transport vehicle configured to move along a traveling rail, and a hoist apparatus coupled to the transport vehicle. The transport vehicle includes a transport vehicle body connected to the traveling rail, and the transport vehicle body has an internal space, and an opening on a lower side thereof, and includes a sliding cover connected to the transport vehicle body and capable of being moved in upward and downward directions.

The hoist apparatus includes a first hoist apparatus coupled to the transport vehicle body, and capable of clutching a first carrier and hoisting and lowering the first carrier in upward and downward directions, and a second hoist apparatus coupled to the transport vehicle body and apart from the first hoist apparatus, and capable of clutching a second carrier and hoisting and lowering the second carrier in upward and downward directions.

According to another aspect of the disclosure, a transport apparatus includes a transport vehicle configured to move along a traveling rail, and a hoist apparatus coupled to the transport vehicle. The transport vehicle includes a transport vehicle body connected to the traveling rail, and the transport vehicle body has an internal space and an opening on a lower side thereof, and includes a sliding cover connected to the transport vehicle body and capable of being moved in upward and downward directions.

The hoist apparatus includes a first hoist apparatus coupled to an upper portion of the transport vehicle body, capable of clutching a first carrier and hoisting and lowering the first carrier in upward and downward directions through the opening, and capable of moving the first carrier in forward and backward directions through the internal space, and a second hoist apparatus coupled to a lower portion of the transport vehicle body and apart from the first hoist apparatus in a downward direction, and capable of clutching a second carrier and hoisting and lowering the second carrier in upward and downward directions.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
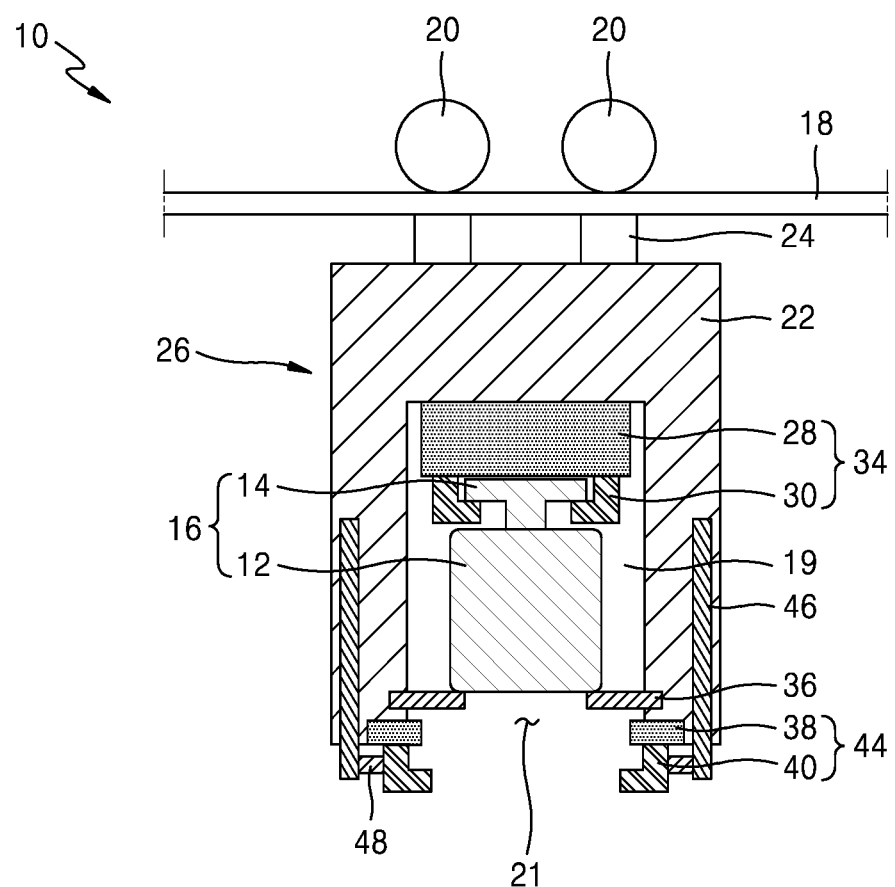
FIGS. 1 and 2 are schematic cross-sectional views illustrating a transport apparatus according to an embodiment.
Figure 1:
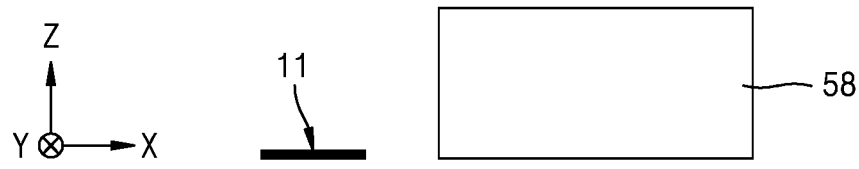

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. The same reference numerals are used for the same components in the drawings, and the same descriptions thereof will be omitted.

Figure 2:
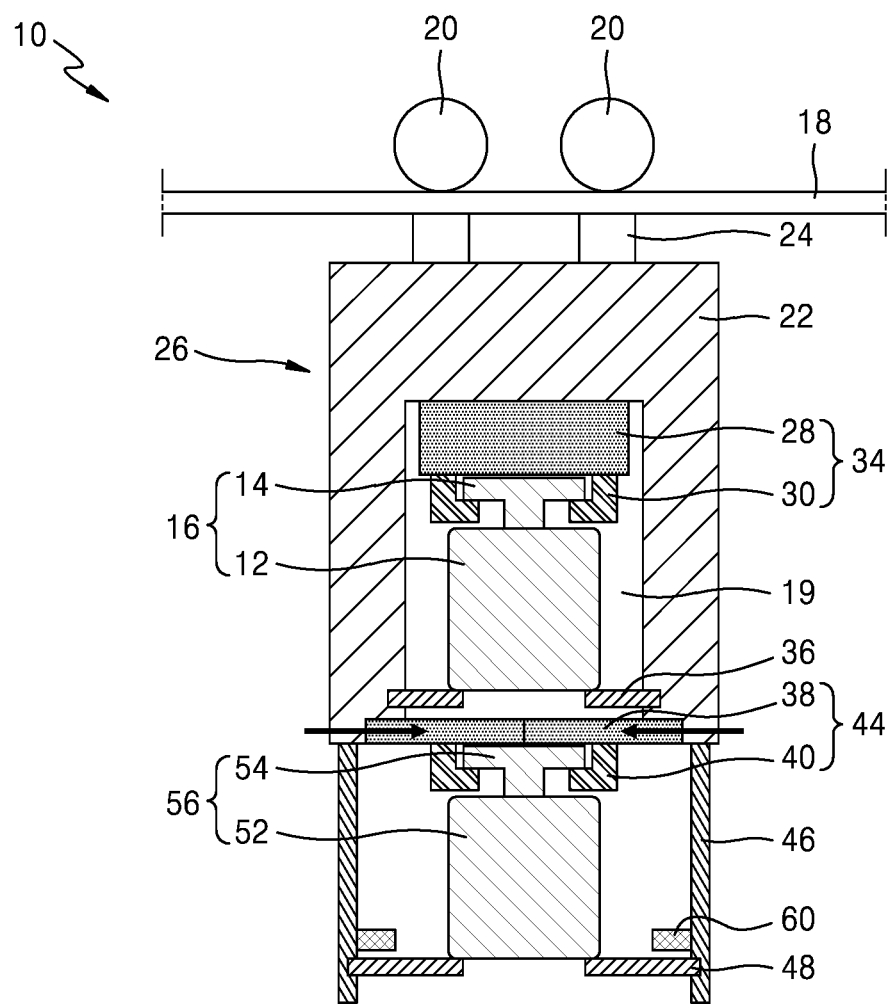
Figure 2:
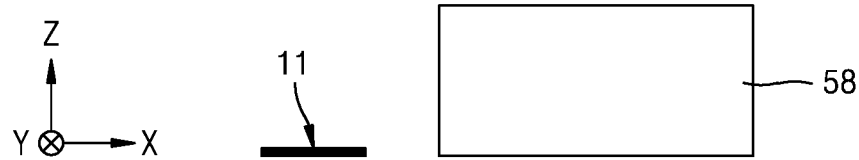

FIGS. 1 and 2 are schematic cross-sectional views illustrating a transport apparatus according to an embodiment.

In detail, a transport apparatus 10 may be an apparatus for transporting first and second carriers 16 and 56 having mounted thereon materials for manufacturing a semiconductor device, for example, wafers and masks. The transport apparatus 10 may be an overhead hoist transport (OHT) apparatus. The first and second carriers 16 and 56 may be referred to as cassettes.

The first and second carriers 16 and 56 may include front opening unified pods (FOUPs), front opening shipping boxes (FOSBs), mask boxes, and the like. In the following description, both the first and second carriers 16 and 56 transport wafers by using FOUPs. However, the spirit of the disclosure may be applied even when the first and second carriers 16 and 56 transport different materials.

FIG. 1 may illustrate that the transport apparatus 10 includes only the first carrier 16 mounted thereon. FIG. 2 may illustrate that the transport apparatus 10 includes both the first and second carriers 16 and 56 mounted thereon. The transport apparatus 10 may include a traveling rail 18 mounted on the ceiling of a manufacturing facility in which a manufacturing process of a semiconductor device is performed, such as a clean room.

The clean room may include a floor 11, and a port 58 of a semiconductor manufacturing facility, i.e., a portion on which the first and second carriers 16 and 56 are seated, may be installed on the floor 11 of the clean room. For a semiconductor device manufacturing process, the first carrier 16 or the second carrier 56 may be seated on the port 58.

After the semiconductor device manufacturing process is completed, the first carrier 16 or the second carrier 56 seated on the port 58 may be mounted on the transport apparatus 10 again and transported along the traveling rail 18. The traveling rail 18 may extend along a set transport path inside the clean room. The traveling rail 18 may be fixed to the ceiling of the clean room by a raceway structure.

The transport apparatus 10 may include a transport vehicle 26 configured to move by a plurality of wheels 20 along the traveling rail 18. The transport vehicle 26 may include a transport vehicle body 22 connected to the traveling rail 18 by using a connection unit 24. The transport vehicle body 22 may include an internal space 19, and an opening 21 on a lower side thereof.

The transport apparatus 10 may include a first hoist apparatus 34 coupled to the transport vehicle 26 to hoist and lower the first carrier 16 in an upward and downward direction (a Z direction). The first hoist apparatus 34 may be coupled to an upper portion of the transport vehicle body 22. The first hoist apparatus 34 may be coupled to an upper portion of the internal space 19 of the transport vehicle body 22. The first hoist apparatus 34 may clutch the first carrier 16, and may hoist and lower the first carrier 16 in the upward and downward direction (the Z direction).

The first carrier 16 may include a first carrier body 12 having wafers mounted thereon, and a first carrier head 14 coupled to the first carrier body 12. The first hoist apparatus 34 may include a first hand portion 28 that may be coupled to the transport vehicle body 22 and may be moved in the upward and downward direction (the Z direction).

The first hoist apparatus 34 may include a first clutch portion 30 that may be coupled to the first hand portion 28 and may clutch (or hold) the first carrier head 14 of the first carrier 16. The first hoist apparatus 34 may include a first hoisting and lowering driving line 32 of FIG. 4 capable of hoisting and lowering the first hand portion 28 and the first clutch portion 30 in the upward and downward direction (the Z direction) through the opening 21. The first hoisting and lowering driving line 32 of FIG. 4 will be described in detail below.

In addition, the first hoist apparatus 34 may be configured to move the first carrier 16 in a forward and backward direction (a Y direction). The movement of the first carrier 16 in the forward and backward direction (the Y direction) using the first hoist apparatus 34 will be described in detail below.

The transport apparatus 10 may include a second hoist apparatus 44 coupled to the transport vehicle 26 to hoist and lower the second carrier 56 in the upward and downward direction (the Z direction). The second hoist apparatus 44 may be coupled to a lower portion of the transport vehicle body 22. The second hoist apparatus 44 may be coupled to a lower portion of the internal space 19 of the transport vehicle body 22. The second hoist apparatus 44 may clutch the second carrier 56, and may hoist and lower the second carrier 56 in the upward and downward direction (the Z direction).

The second carrier 56 may have the same structure as the first carrier 16. The second carrier 56 may include a second carrier body 52 having wafers mounted thereon, and a second carrier head 54 coupled to the second carrier body 52. The second hoist apparatus 44 may include a second hand portion 38 that may be coupled to the transport vehicle body 22 and may be moved in the upward and downward direction (the Z direction).

As illustrated in FIG. 1, the second hand portion 38 is coupled, in a separated form, to the transport vehicle body 22 on both sides of the opening 21 of the transport vehicle body 22. In addition, as illustrated in FIG. 2, the second hand portion 38 may extend in a left-right direction (an X direction) on both sides of the transport vehicle body 22 to fully cover the opening 21 of the transport vehicle body 22.

In some embodiments, unlike the illustration in FIG. 2, the second hand portion 38 may extend in the left-right direction (the X direction) on both sides of the transport vehicle body 22 to partially cover the opening 21 of the transport vehicle body 22.

The second hoist apparatus 44 may include a second clutch portion 40 that may be coupled to the second hand portion 38 to clutch (or hold) the second carrier head 54 of the second carrier 56. The second hoist apparatus 44 may include a second hoisting and lowering driving line 43 of FIG. 13 capable of hoisting and lowering the second hand portion 38 and the second clutch portion 40 in the upward and downward direction (the Z direction).

The transport vehicle 26 may include, at the lower portion of the transport vehicle body 22, a first anti-drop 36 capable of supporting a bottom portion of the first carrier 16. As illustrated in FIG. 1, the first anti-drop 36 may be installed to prevent the first carrier 16 from dropping. The first anti-drop 36 may move or pivot in the forward and backward direction (the Y direction). Accordingly, the first anti-drop 36 may not interfere with the movement of the first carrier 16 in the upward and downward direction (the Z direction).

The transport vehicle 26 may include a sliding cover 46 capable of being moved in the upward and downward direction (the Z direction), which is installed on the transport vehicle body 22. FIG. 1 illustrates that the sliding cover 46 is located inside the transport vehicle body 22. FIG. 2 illustrates that the sliding cover 46 is moved downwards from the transport vehicle body 22.

The transport vehicle 26 may include, at a lower portion of the sliding cover 46, a second anti-drop 48 capable of supporting a bottom portion of the second carrier 56. As illustrated in FIG. 2, the second anti-drop 48 may be installed to prevent the second carrier 56 from dropping. The second anti-drop 48 may move or pivot in the forward and backward direction (the Y direction). Accordingly, the second anti-drop 48 may not interfere with the movement of the second carrier 56 in the upward and downward direction (the Z direction).

The transport vehicle 26 may include, at the lower portion of the sliding cover 46, a sensor 60 capable of monitoring the movement of the second carrier 56 in the upward and downward direction (the Z direction). The sensor 60 may be an optical sensor. The sensor 60 may improve movement precision of the second carrier 56 by monitoring the movement of the second carrier 56 in the upward and downward direction (the Z direction).

The transport apparatus 10 described above includes two carriers, i.e., the first and second carriers 16 and 56. However, the disclosure may be applied even when the transport apparatus 10 includes more than two carriers. The transport apparatus 10 may more efficiently transport a larger number of materials for manufacturing a semiconductor device by including a plurality of carriers.

Figure 3:
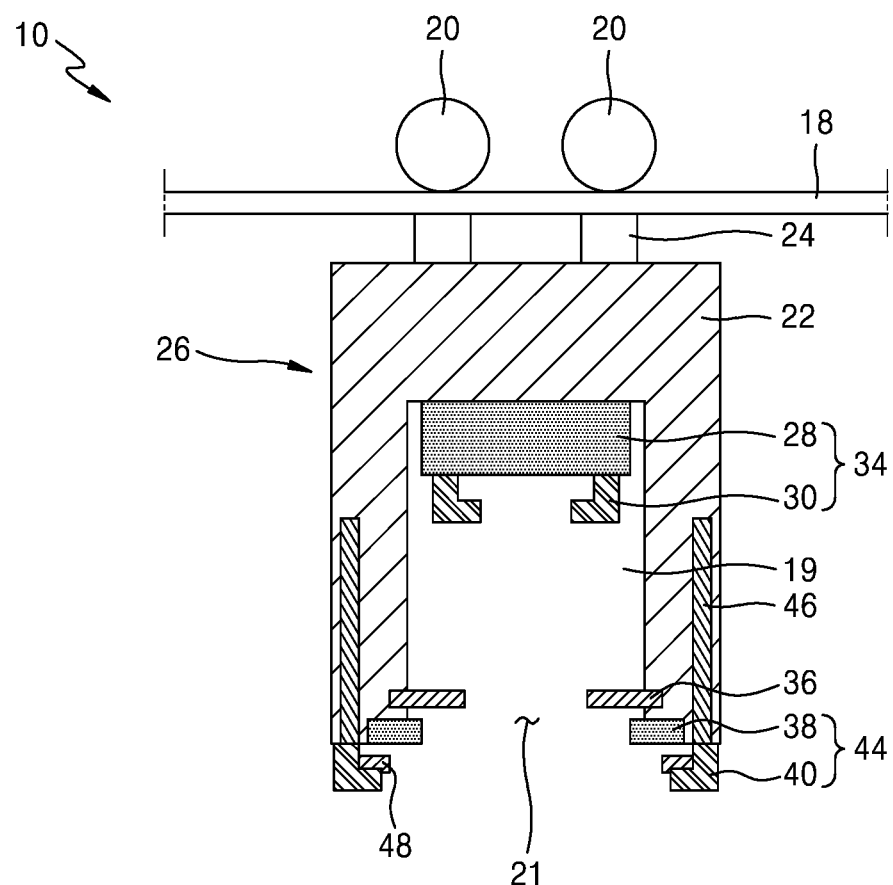
FIGS. 3 to 5 are cross-sectional views illustrating a process of transporting a first carrier by using a transport apparatus, according to an embodiment.
Figure 3:
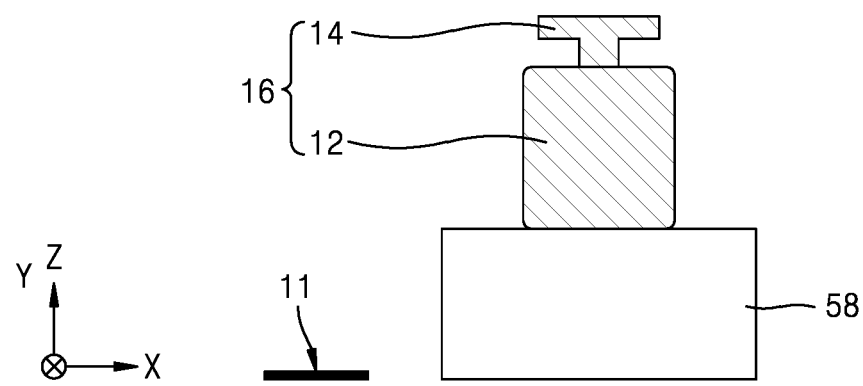
Figure 4:
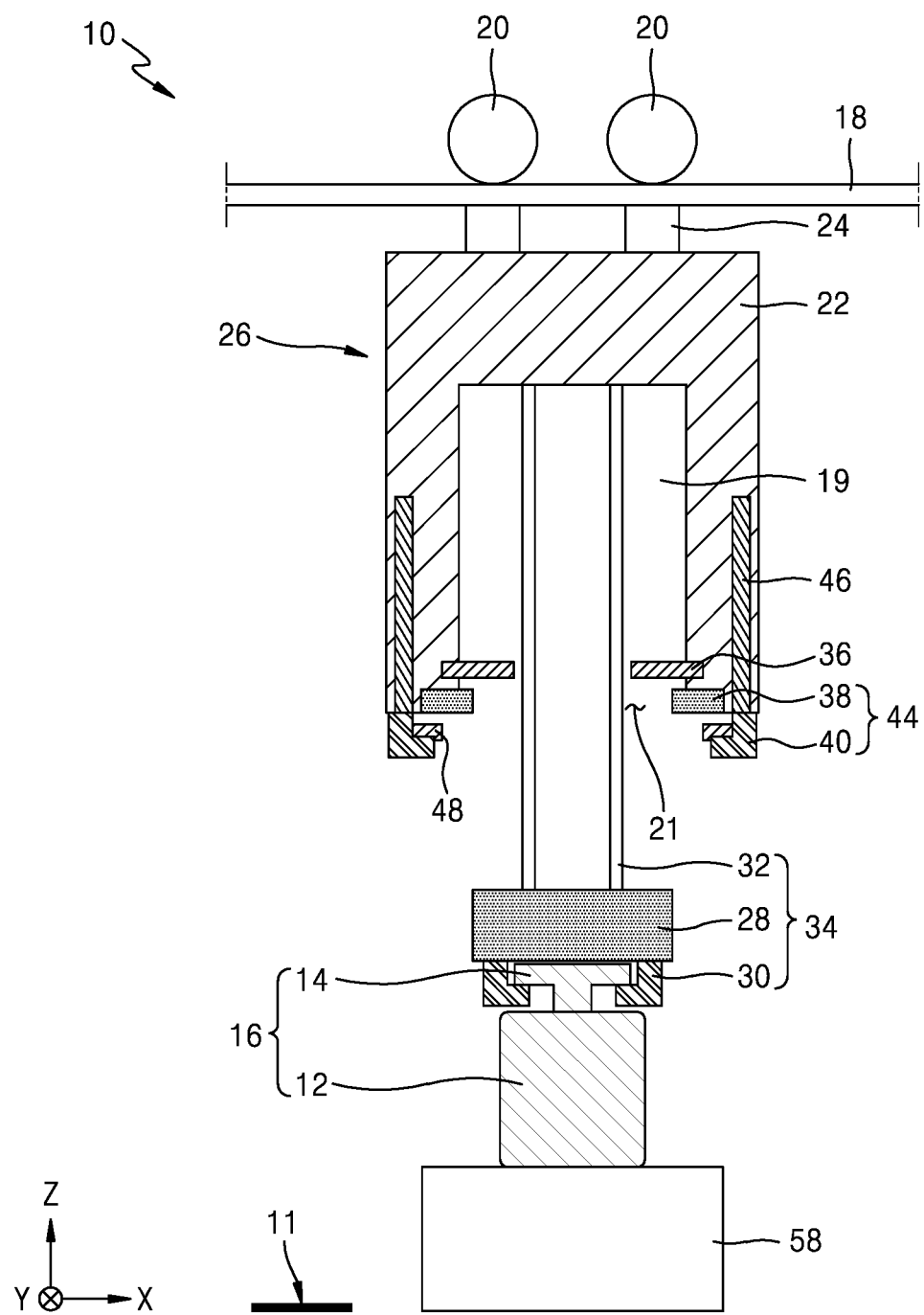
Figure 5:
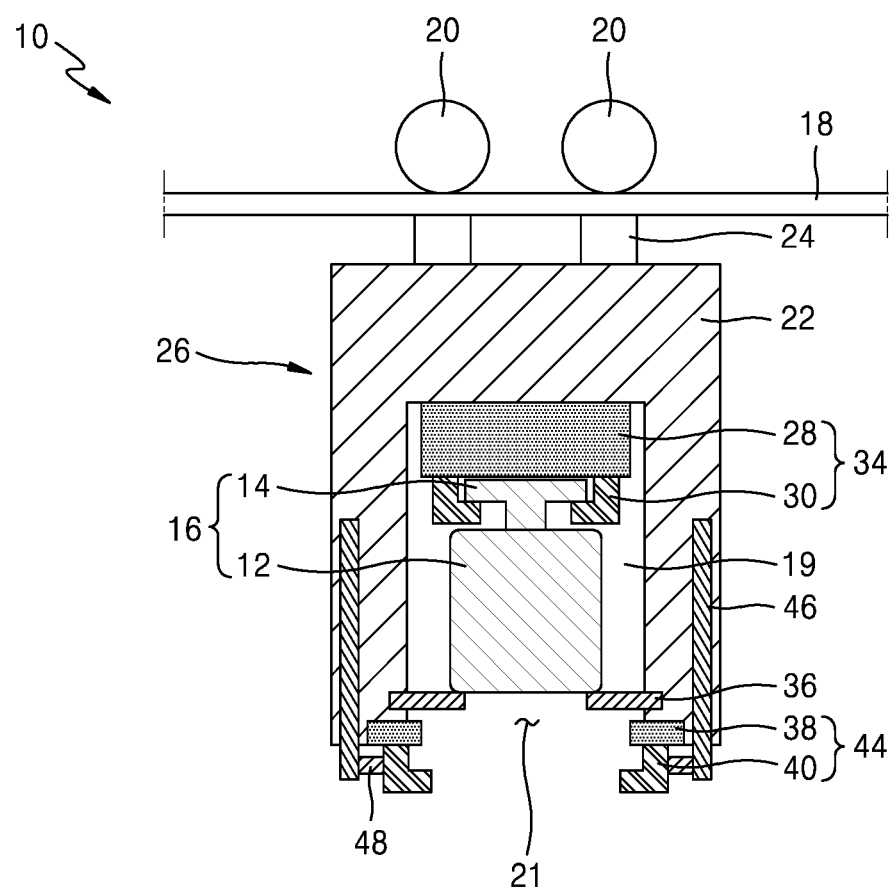
Figure 5:
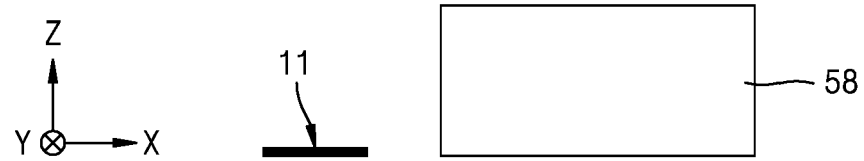

FIGS. 3 to 5 are cross-sectional views illustrating a process of transporting a first carrier by using a transport apparatus, according to an embodiment.

In detail, the same reference numerals of FIGS. 3 to 5 as those of FIGS. 1 and 2 denote the same elements. The same descriptions of FIGS. 3 to 5 as those of FIGS. 1 and 2 will be briefly described or omitted herein.

FIG. 3 illustrates that a first carrier 16 is located on a port 58. A transport apparatus 10 including a transport vehicle 26 may be located above the port 58 on which the first carrier 16 is located. The transport vehicle 26 may be located apart from the port 58 in an upward direction (a +Z direction). The transport vehicle 26 may include a transport vehicle body 22, and a first hoist apparatus 34 and a first anti-drop 36 coupled to the transport vehicle body 22.

FIG. 4 illustrates that the first hoist apparatus 34 is moved in a downward direction (a −Z direction). The first hoisting and lowering driving line 32 constituting the first hoist apparatus 34 is moved in the downward direction (the −Z direction). In this case, a first hand portion 28 and a first clutch portion 30 constituting the first hoist apparatus 34 may be moved in the downward direction (the −Z direction).

The first hoisting and lowering driving line 32 may be connected to a first hoisting and lowering driving unit (not shown), e.g., a hoisting and lowering driving motor or the like. As described above, the first anti-drop 36 may move or pivot in a forward and backward direction (a Y direction) not to interfere with movement of the first hand portion 28 and the first clutch portion 30 in an upward and downward direction (a Z direction).

Subsequently, the first clutch portion 30 moves in a left and right direction (an X direction) to clutch (or hold) a first carrier head 14 of the first carrier 16. The first clutch portion 30 may be moved by a clutch portion driving unit (not shown), e.g., a clutch portion driving motor.

FIG. 5 illustrates that the first carrier 16 is moved in the upward direction (the +Z direction) by using the first hoist apparatus 34. The first hoisting and lowering driving line 32 of FIG. 4 constituting the first hoist apparatus 34 is moved in the upward direction (the +Z direction). In this case, the first hand portion 28 and the first clutch portion 30 constituting the first hoist apparatus 34 may be moved in the upward direction (the +Z direction), and the first carrier 16 may also be mounted in an internal space 19 of the transport vehicle body 22.

Subsequently, the first anti-drop 36 may move or pivot in the forward and backward direction (the Y direction) to support a bottom portion of the first carrier 16 to prevent the first carrier 16 from dropping.

FIG. 6 to FIG. 10 are views illustrating a process of transporting a first carrier after mounting a second carrier by using a transport apparatus, according to an embodiment.

Figure 6:
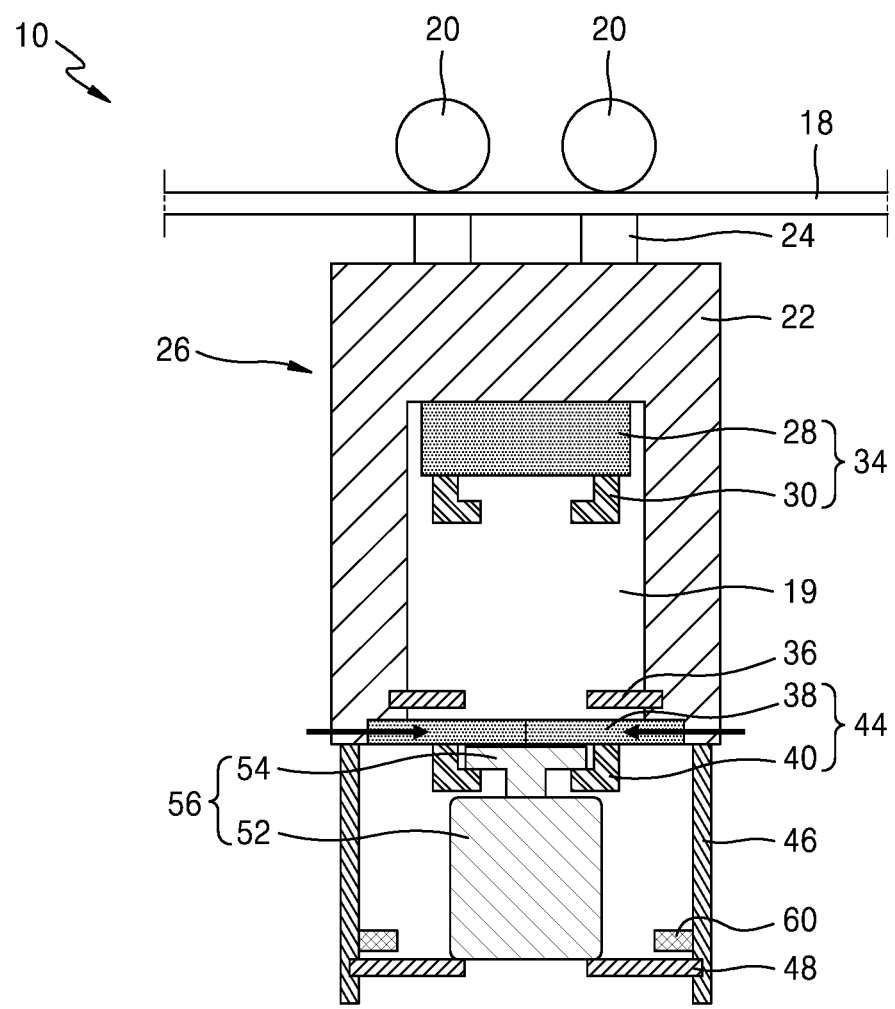
FIG. 6 to FIG. 10 are views illustrating a process of transporting a first carrier after mounting a second carrier by using a transport apparatus, according to an embodiment.
Figure 6:
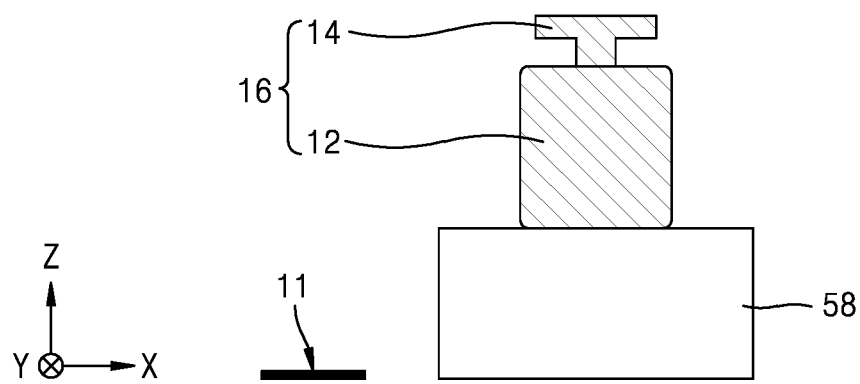
Figure 7:
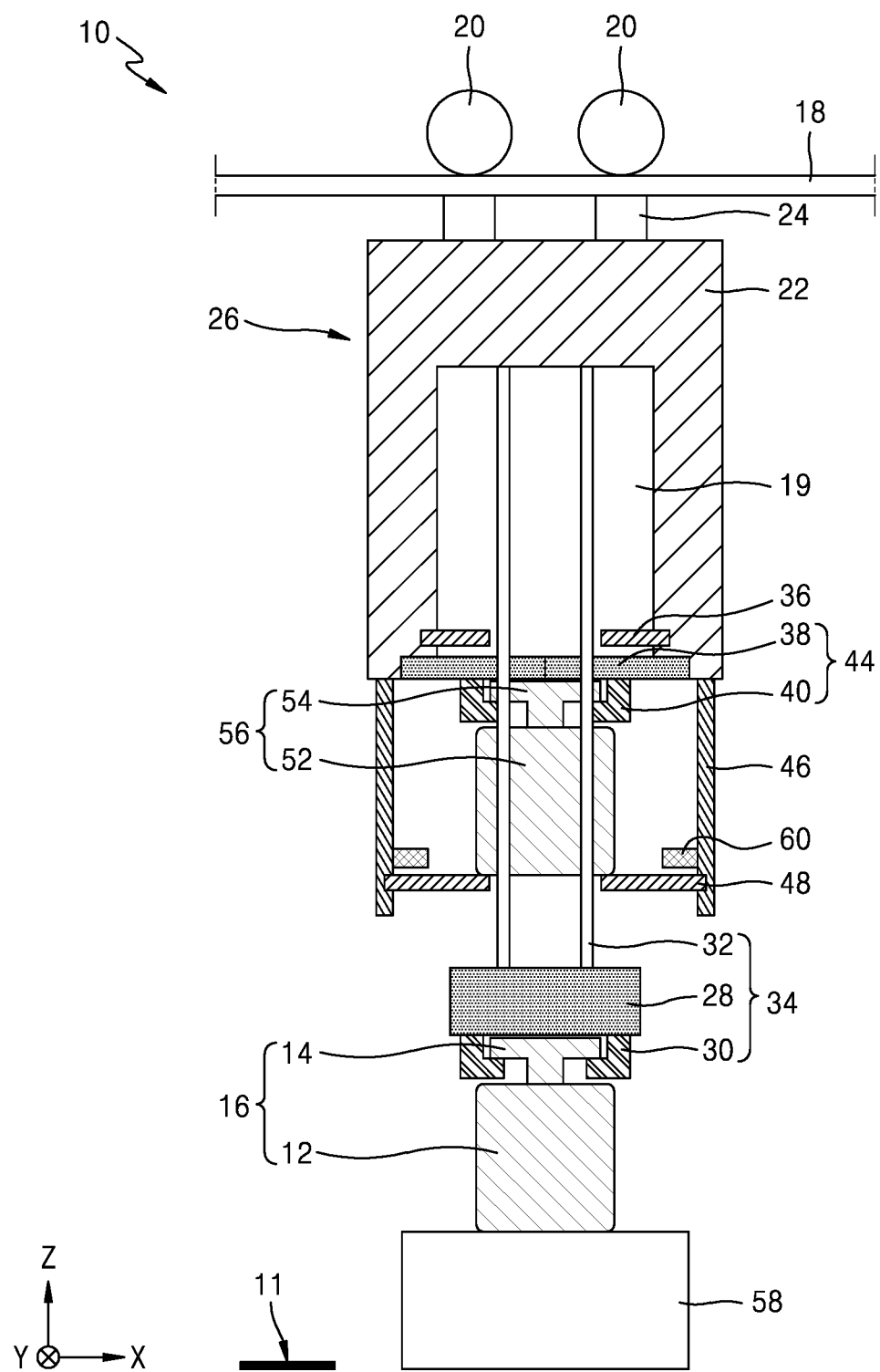
Figure 8:
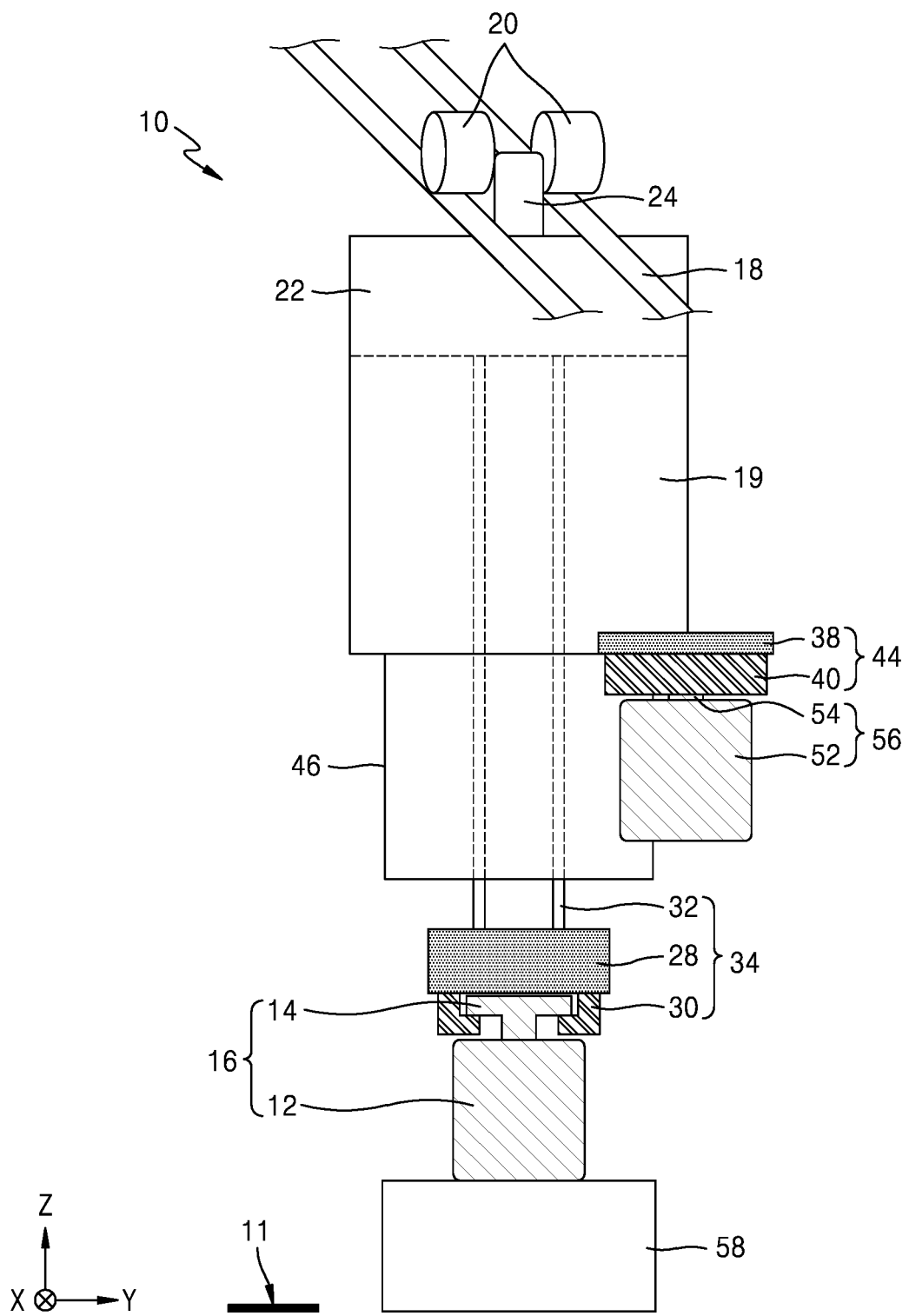
Figure 9:
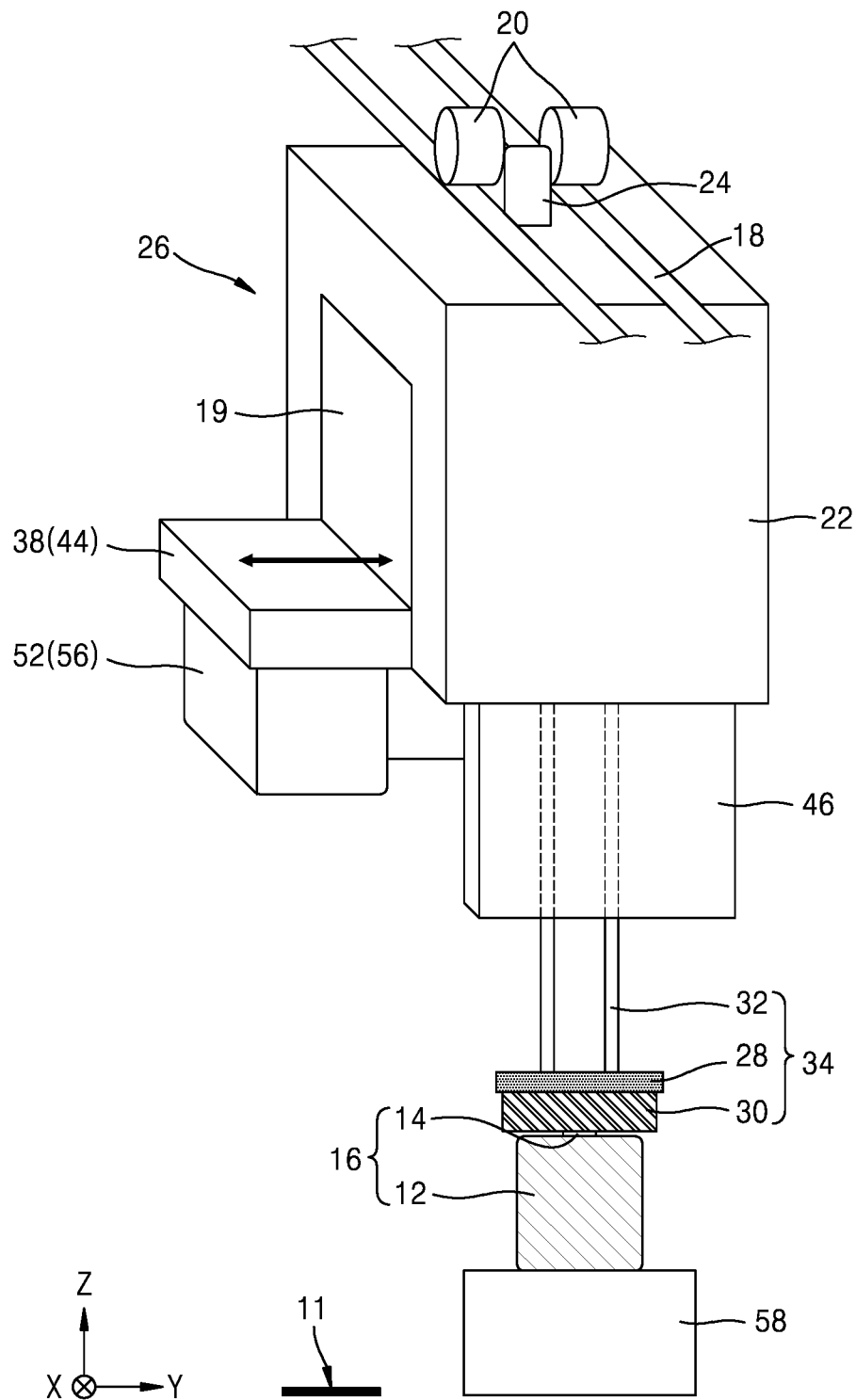
Figure 10:
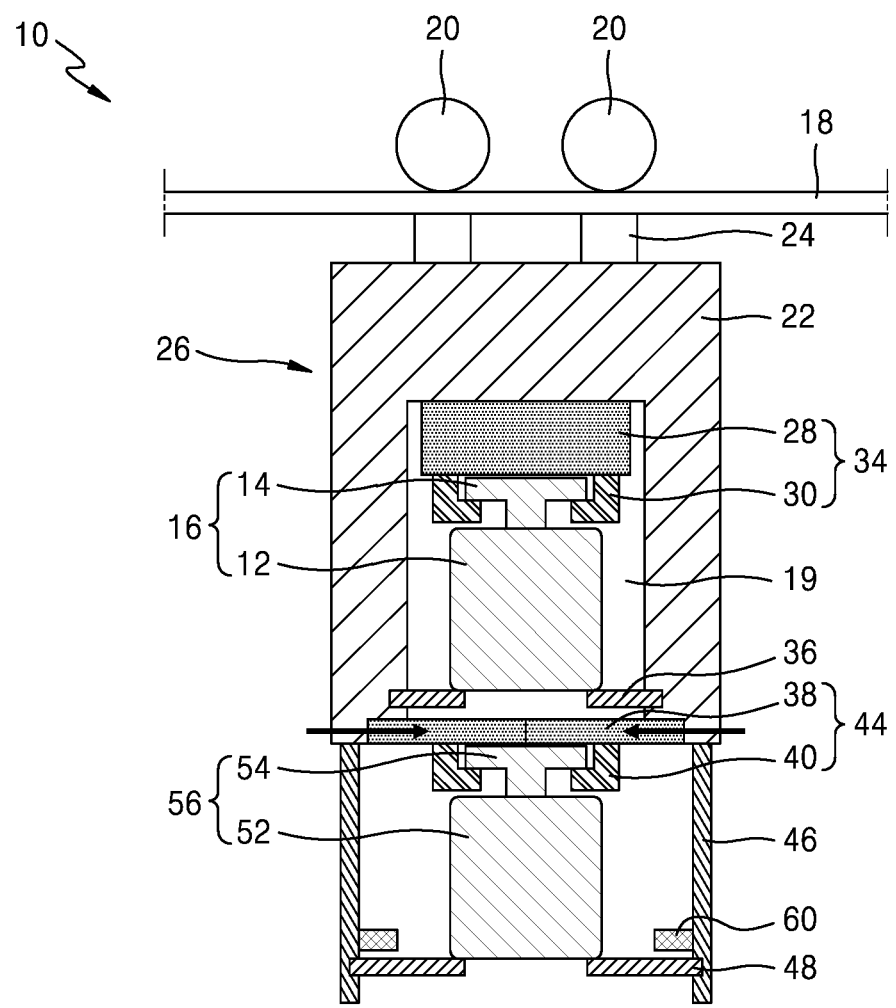
Figure 10:
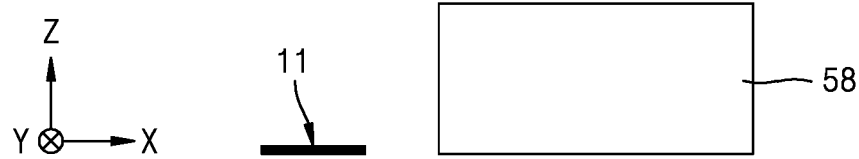

In detail, the same reference numerals of FIGS. 6 to 10 as those of FIGS. 1 and 2 denote the same elements. The same descriptions of FIGS. 6 to 10 as those of FIGS. 1 and 2 will be briefly described or omitted herein. FIGS. 6, 7, and 10 are cross-sectional views, and FIGS. 8 and 9 are perspective views.

FIG. 6 illustrates that a first carrier 16 is located on a port 58, and a second carrier 56 is mounted on a transport vehicle 26. A transport apparatus 10 including the transport vehicle 26 may be located above the port 58. The transport vehicle 26 may be located, in an upward direction (a +Z direction), apart from the port 58 on which the first carrier 16 is located.

The transport vehicle 26 may include a transport vehicle body 22, and a second hoist apparatus 44 and a second anti-drop 48 coupled to the transport vehicle body 22. The second carrier 56 is coupled to the second hoist apparatus 44, and the second anti-drop 48 is supported on a bottom portion of the second carrier 56.

FIGS. 7 to 9 illustrate that a first hoist apparatus 34 is moved in a downward direction (a −Z direction) while the second carrier 56 is mounted. A first hoisting and lowering driving line 32 constituting the first hoist apparatus 34 is moved in the downward direction (the −Z direction). In this case, a first hand portion 28 and a first clutch portion constituting the first hoist apparatus 34 may be moved in the downward direction (the −Z direction).

The first hoisting and lowering driving line 32 may be connected to a first hoisting and lowering driving unit (not shown), e.g., a hoisting and lowering driving motor or the like. As described above, a first anti-drop 36 may move or pivot in a forward and backward direction (a Y direction) not to interfere with movement of the first hand portion 28 and the first clutch portion 30 in an upward and downward direction (a Z direction).

As illustrated in FIGS. 8 and 9, when the first hoisting and lowering driving line 32 constituting the first hoist apparatus 34 is moved in the downward direction (the −Z direction), the second hoist apparatus 44 and the second carrier 56 may be moved in the forward or downward direction (a +Y direction or a −Y direction) through an internal space 19.

Accordingly, when the first hoisting and lowering driving line 32 constituting the first hoist apparatus 34 is moved in the downward direction (the −Z direction), the second hoist apparatus 44 and the second carrier 56 may not interfere with the movement of the first carrier 16.

Subsequently, the first clutch portion 30 constituting the first hoist apparatus 34 moves in a left and right direction (an X direction) to clutch (or hold) a first carrier head 14 of the first carrier 16. The first clutch portion 30 may be moved by a clutch portion driving unit (not shown), e.g., a clutch portion driving motor.

FIG. 10 illustrates that the first carrier 16 is moved in the upward direction (the +Z direction) by using the first hoist apparatus 34 while the second carrier 56 is mounted. The first hoisting and lowering driving line 32 of FIG. 4 constituting the first hoist apparatus 34 is moved in the upward direction (the +Z direction). In this case, the first hand portion 28 and the first clutch portion 30 constituting the first hoist apparatus 34 may be moved in the upward direction (the +Z direction), and the first carrier 16 may also be mounted in the internal space 19 of the transport vehicle body 22.

Subsequently, the first anti-drop 36 may move or pivot in the forward and downward direction (the Y direction) to support a bottom portion of the first carrier 16 to prevent the first carrier 16 from dropping.

FIGS. 11 to 14 are cross-sectional views illustrating a process of transporting a second carrier after mounting a first carrier by using a transport apparatus, according to an embodiment.

In detail, the same reference numerals of FIGS. 11 to 14 as those of FIGS. 1 and 2 denote the same elements. The same descriptions of FIGS. 11 to 14 as those of FIGS. 1 and 2 will be briefly described or omitted herein.

Figure 11:
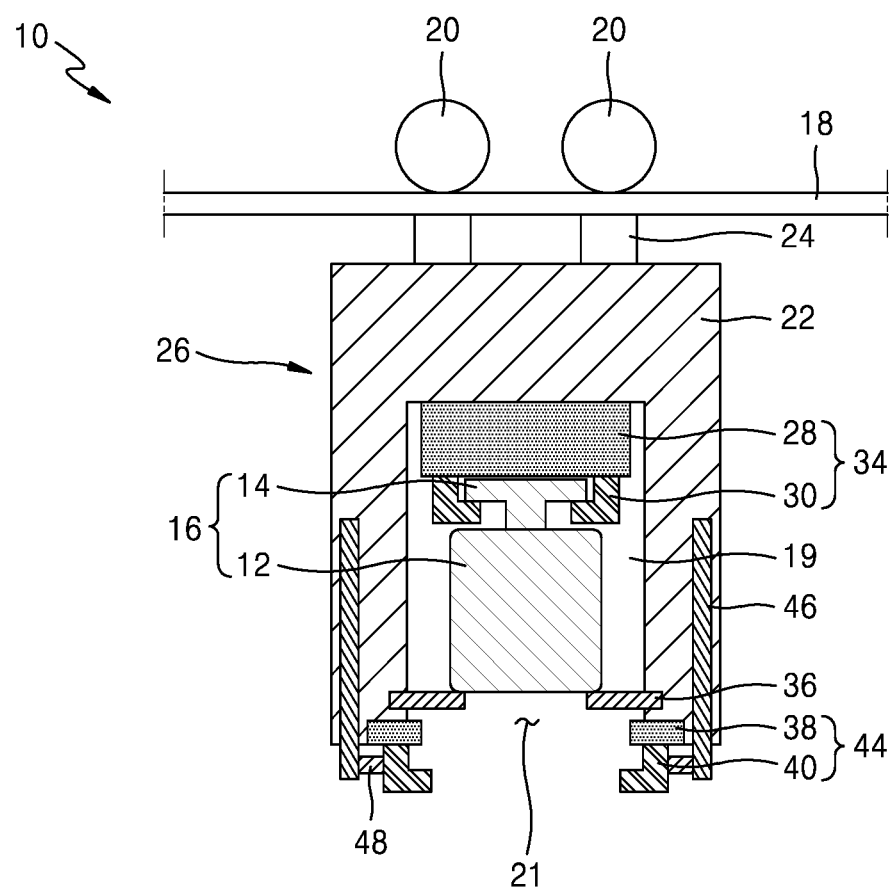
FIGS. 11 to 14 are cross-sectional views illustrating a process of transporting a second carrier after mounting a first carrier by using a transport apparatus, according to an embodiment.
Figure 11:
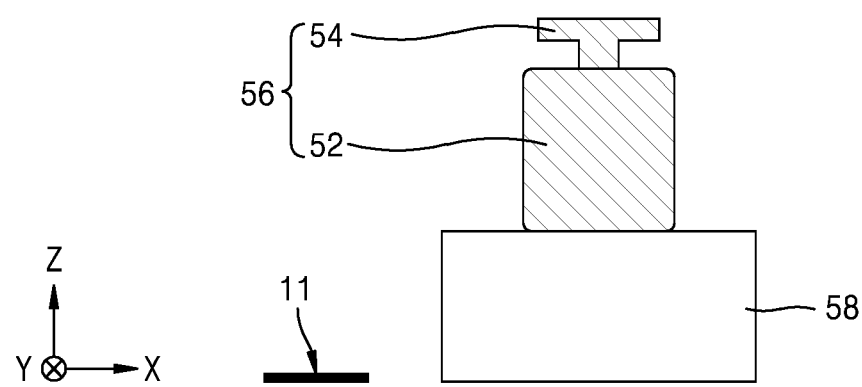

FIG. 11 illustrates that a second carrier 56 is located on a port 58, and a first carrier 16 is mounted on a transport vehicle 26. A transport apparatus 10 including the transport vehicle 26 may be located above the port 58 on which the second carrier 56 is located. The transport vehicle 26 may be located, in an upward direction (a +Z direction), apart from the port 58 on which the second carrier 56 is located.

The transport vehicle 26 may include a transport vehicle body 22, and a first hoist apparatus 34 and a first anti-drop 36 coupled to the transport vehicle body 22. The transport vehicle 26 may include a second hoist apparatus 44 and a sliding cover 46 coupled to the transport vehicle body 22, and a second anti-drop 48 coupled to the sliding cover 46. The first carrier 16 is coupled to the first hoist apparatus 34, and a bottom portion of the first carrier 16 is supported by the first anti-drop 36.

Figure 12:
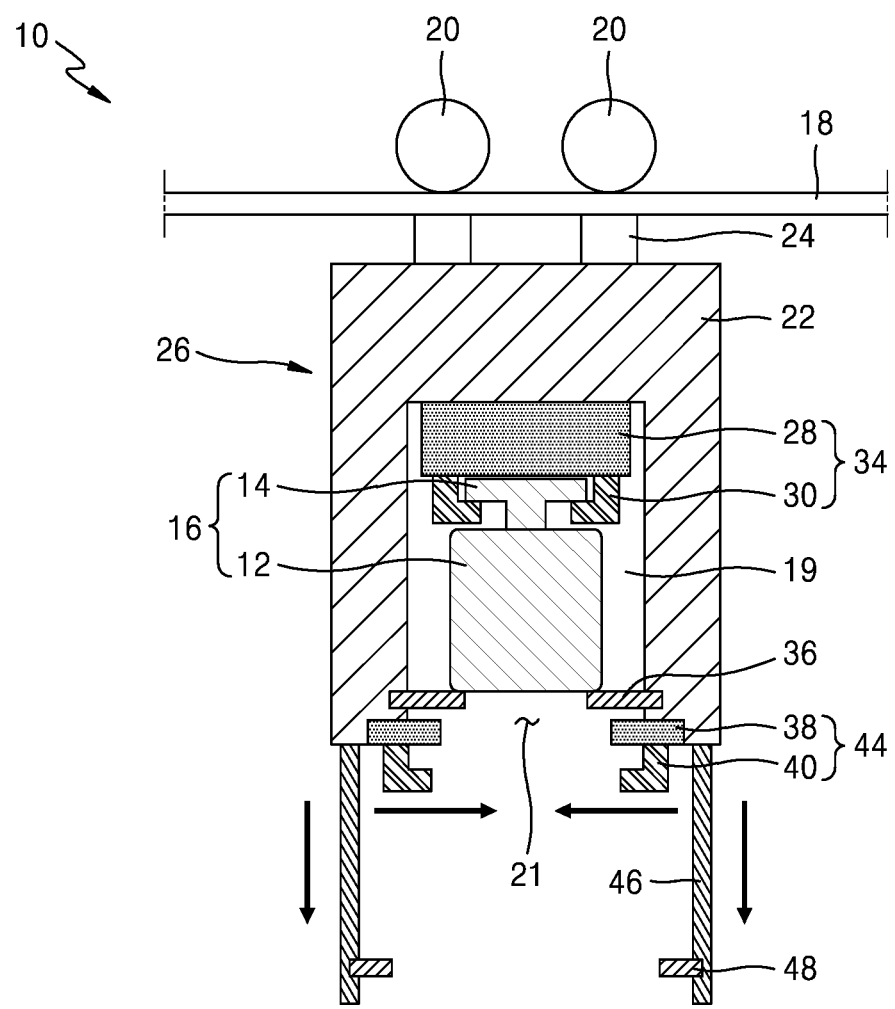
Figure 12:
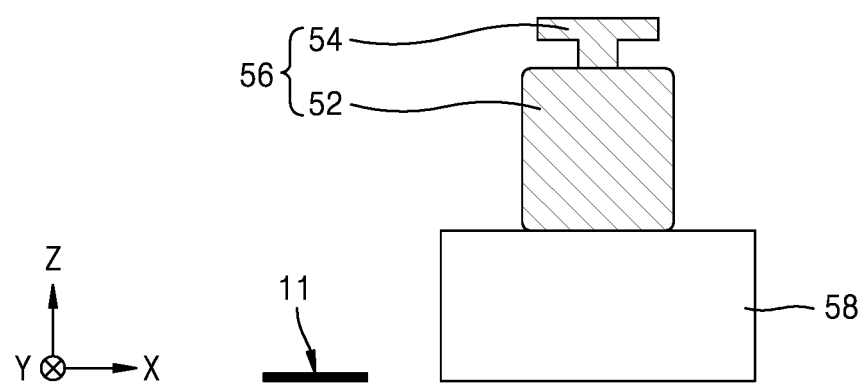

FIG. 12 illustrates that a second hand portion 38 extends, and the sliding cover 46 moves. The second hand portion 38 of the second hoist amplifiers 44 extends in a left and right direction (an X direction) on both sides of the transport vehicle body 22. In this case, as illustrated in FIG. 13, an opening 21 of the transport vehicle body 22 may be covered.

Subsequently, the sliding cover 46 is moved in a downward direction (a −Z direction). When the sliding cover 46 is moved in the downward direction (the −Z direction), as described below, the second carrier 56 may be mounted inside the sliding cover 46.

Figure 13:
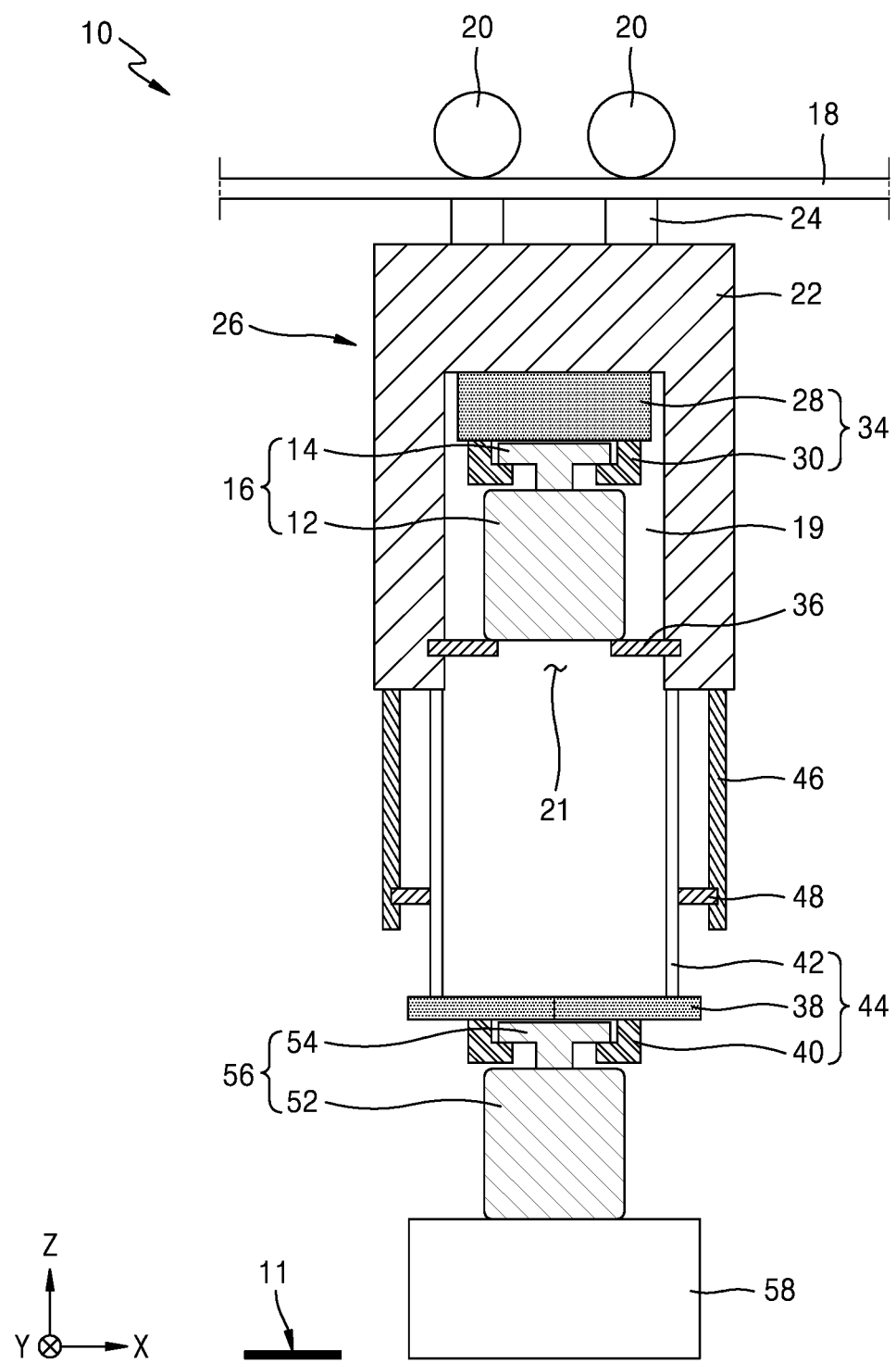

FIG. 13 illustrates that the second hoist apparatus 44 is moved in the downward direction (the −Z direction) while the first carrier 16 is mounted. A second hoisting and lowering driving line 42 constituting the second hoist apparatus 44 is moved in the downward direction (the −Z direction). In this case, the second hand portion 38 and a second clutch portion 40 constituting the second hoist apparatus 44 may be moved in the downward direction (the −Z direction).

The second hoisting and lowering driving line 42 may be connected to a second hoisting and lowering driving unit (not shown), e.g., a hoisting and lowering driving motor or the like. As described above, the second anti-drop 48 may move or pivot in a forward and downward direction (a Y direction) not to interfere the movement of the second hand portion 38 and the second clutch portion 40 in an upward and downward direction (a Z direction).

Subsequently, the second clutch portion 40 constituting the second hoist apparatus 34-44 moves in the left and right direction (the X direction) to clutch (or hold) a second carrier head 54 of the second carrier 56. The second clutch portion 40 may be moved by a clutch portion driving unit (not shown), e.g., a clutch portion driving motor.

Figure 14:
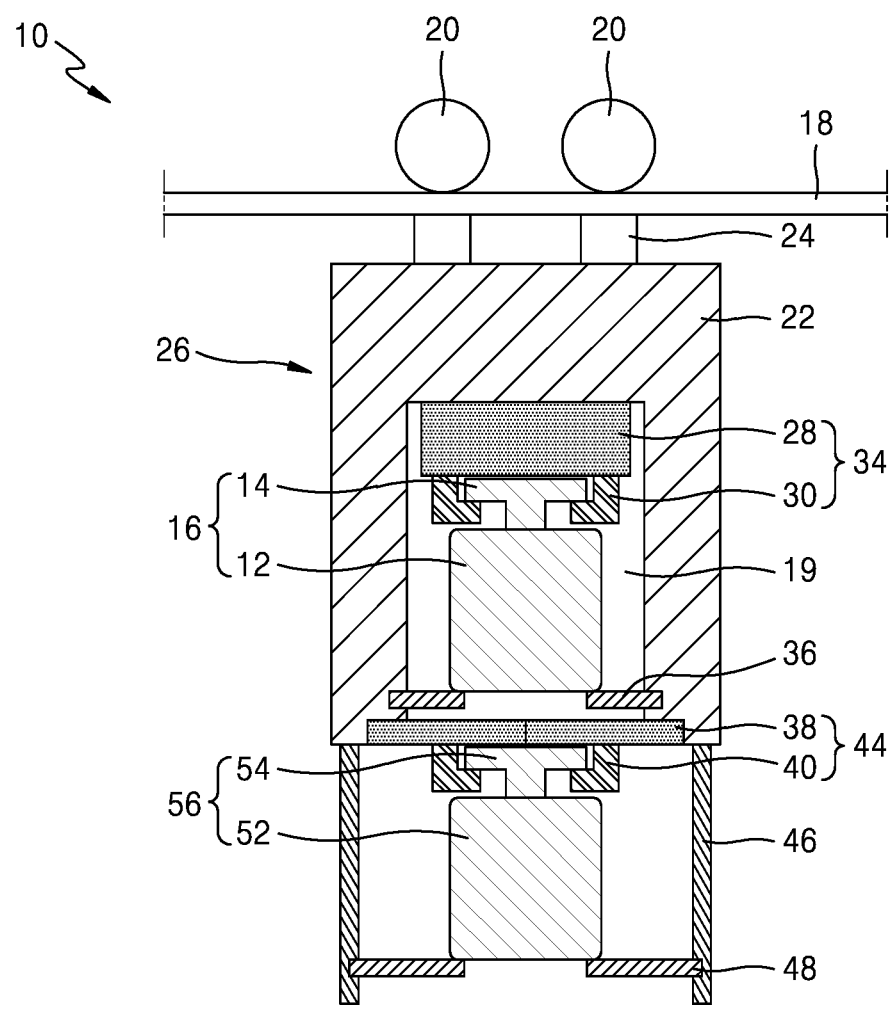
Figure 14:
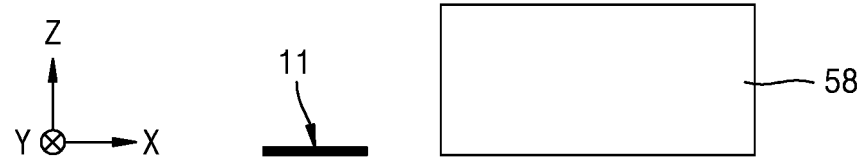

FIG. 14 illustrates that the second carrier 56 is moved in an upward direction (a +Z direction) by using the second hoist apparatus 44 while the first carrier 16 is mounted. A third hoisting and lowering driving line 42 of FIG. 13 constituting the second hoist apparatus 44 is moved in the upward direction (the +Z direction). In this case, the second hand portion 38-38 and the second clutch portion 40 constituting the second hoist apparatus 44 may be moved in the upward direction (the +Z direction), and the second carrier 56 may also be mounted inside the sliding cover 46.

Subsequently, the second anti-drop 48 may move or pivot in the forward and downward direction (the Y direction) to support a bottom portion of the second carrier 56 to prevent the second carrier 56 from dropping.

Figure 15:
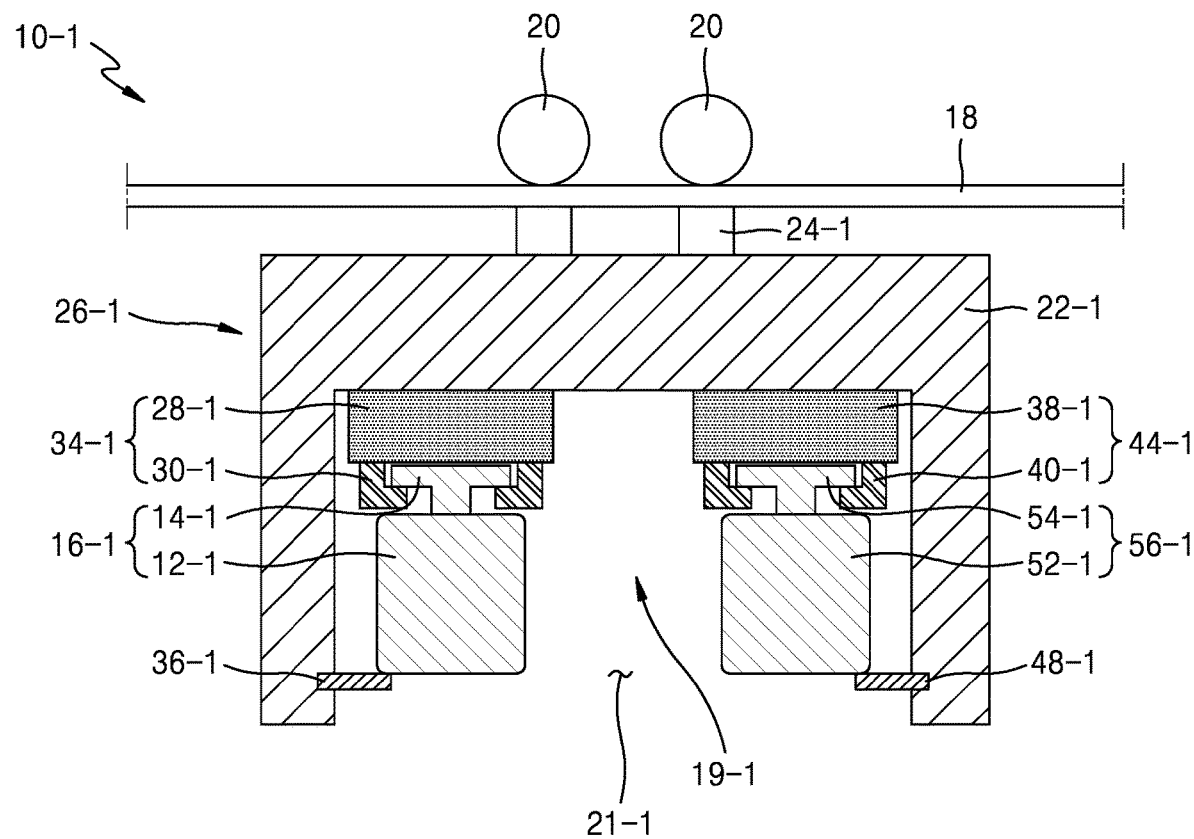
FIG. 15 is a schematic cross-sectional view illustrating a transport apparatus according to an embodiment.
Figure 15:
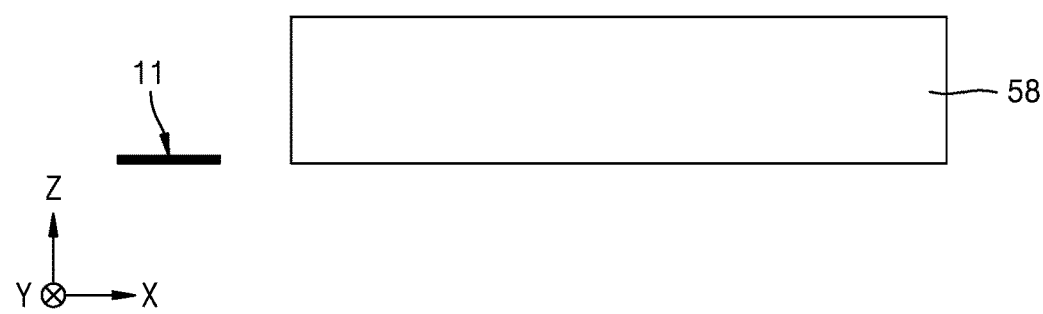

FIG. 15 is a schematic cross-sectional view illustrating a transport apparatus according to an embodiment.

In detail, a transport apparatus 10-1 may be almost the same as the transport apparatus 10 of FIGS. 1 and 2, except that a first carrier 16-1 and a second carrier 56-1 are mounted apart from each other in a left and right direction (an X direction) on a transport vehicle 26-1 located above a port 58. Reference numerals of FIG. 15, which are the same as or similar to those of FIGS. 1 and 2, denote the same or similar elements. The same descriptions of FIG. 15 as those of FIGS. 1 and 2 will be briefly described or omitted herein.

The transport apparatus 10-1 may include the transport vehicle 26-1 configured to move by a plurality of wheels 20 along a traveling rail 18. The transport vehicle 26-1 may include a transport vehicle body 22-1 connected to the traveling rail 18 by using a connection unit 24-1. The transport vehicle body 22-1 may include an internal space 19-1 and an opening 21-1 located on a lower side thereof.

The transport apparatus 10-1 may include a first hoist apparatus 34-1 coupled to the transport vehicle 26-1 to hoist and lower the first carrier 16-1 in an upward and downward direction (a Z direction). The first hoist apparatus 34-1 and the first carrier 16-1 may correspond to the first hoist apparatus 34 and the first carrier 16 of FIGS. 1 and 2, respectively.

The first hoist apparatus 34-1 may be coupled to an upper portion of the transport vehicle body 22-1. The first hoist apparatus 34-1 may be coupled to an upper portion of the internal space 19-1 of the transport vehicle body 22-1.

The first hoist apparatus 34-1 may clutch the first carrier 16-1, and may hoist and lower the first carrier 16-1 in the upward and downward direction (Z direction). The first carrier 16-1 may include a first carrier body 12-1 having wafers mounted thereon, and a first carrier head 14-1 coupled to the first carrier body 12-1.

The first hoist apparatus 34-1 may include a first hand portion 28-1 that may be coupled to the transport vehicle body 22-1 and may be moved in the upward and downward direction (the Z direction). For convenience of description, a first hoisting and lowering driving line capable of hoisting and lowering the first hand portion 28-1 and a second clutch portion 30-1 in the upward and downward direction (the Z direction) is not illustrated in FIG. 15. A first anti-drop 36-1 supporting a bottom portion of the first carrier 16-1 may be located at a lower portion of the transport vehicle body 22-1.

A second hoist apparatus 44-1 may be located apart from the first hoist apparatus 34-1 in a left direction (an X direction). The second hoist apparatus 44-1 may be coupled to the upper portion of the transport vehicle body 22-1. The second hoist apparatus 44-1 may be coupled to the upper portion of the internal space 19-1 of the transport vehicle body 22-1.

The second hoist apparatus 44-1 may clutch the second carrier 56-1, and may hoist and lower the second carrier 56-1 in the upward and downward direction (the Z direction). The second carrier 56-1 may include a second carrier body 52-1 having wafers mounted thereon, and a second carrier head 54-1 coupled to the second carrier body 52-1.

The second hoist apparatus 44-1 may include a second hand portion 38-1 that may be coupled to the transport vehicle body 22-1 and may be moved in the upward and downward direction (the Z direction). For convenience of description, a second hoisting and lowering driving line capable of hoisting and lowering the second hand portion 38-1 and a second clutch portion 40-1 in the upward and downward direction (the Z direction) is not illustrated in FIG. 15. A second anti-drop 48-1 for supporting a bottom portion of the second carrier 56-1 may be located at a lower portion of the transport vehicle body 22-1.

Figure 16:
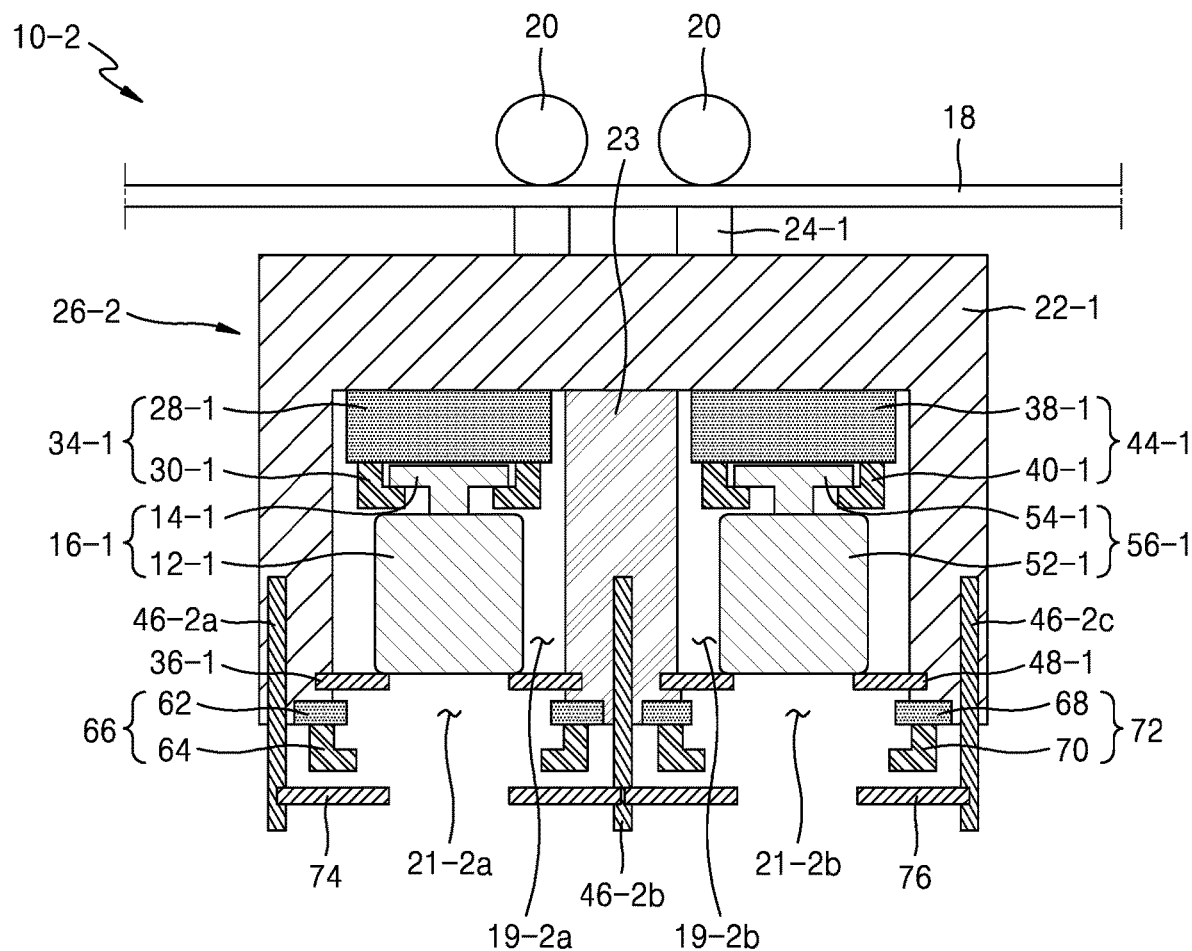
FIGS. 16 and 17 are schematic cross-sectional views illustrating a transport apparatus, according to an embodiment.
Figure 17:
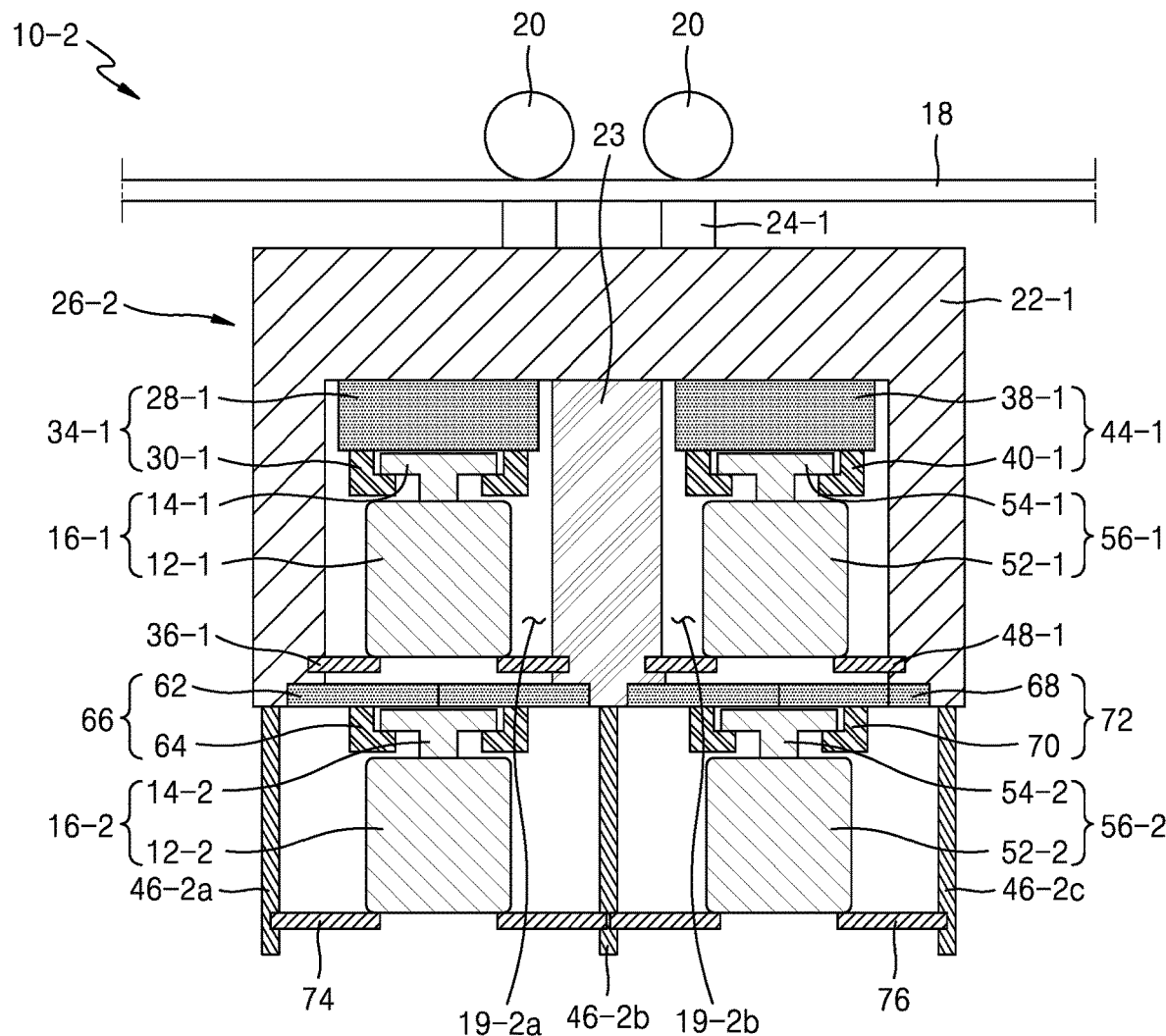

FIGS. 16 and 17 are schematic cross-sectional views illustrating a transport apparatus, according to an embodiment.

In detail, a transport apparatus 10-2 may be almost the same as the transport apparatus 10-1 of FIG. 15, except that a third carrier 16-2 and a fourth carrier 56-2 are further mounted under a first carrier 16-1 and a second carrier 56-1, respectively, on a transport vehicle 26-2 located above a port 58.

Reference numerals of FIGS. 16 and 17, which are the same as or similar to those of FIGS. 1, 2, and 15, denote the same or similar elements. The same descriptions of FIGS. 16 and 17 as those of FIGS. 1, 2, and 15 will be briefly described or omitted herein.

The transport apparatus 10-2 may include the transport vehicle 26-2 configured to move by a plurality of wheels 20 along a traveling rail 18. The transport vehicle 26-2 may include a transport vehicle body 22-1 connected to the traveling rail 18 by using a connection unit 24-1.

The transport vehicle body 22-1 may include an additional transport vehicle body 23 for separating a first hoist apparatus 34-1 and the second hoist apparatus 44-1 from each other. The first hoist apparatus 34-1 may be configured to move the first carrier 16-1 in an upward and downward direction (a Z direction) and a forward and backward direction (a Y direction). The second hoist apparatus 44-1 may be configured to move the second carrier 56-1 in upward and downward direction (the Z direction) and the forward and backward direction (the Y direction).

The transport vehicle body 22-1 may include two internal spaces 19-2a and 19-2b, and two openings 21-2a and 21-2b on a lower side thereof according to the installation of the additional transport vehicle body 23. The transport vehicle 26-2 may include a third hoist apparatus 66 that is located below the first carrier 16-1 and coupled to the transport vehicle body 22-1 and the additional transport vehicle body 23.

The third hoist apparatus 66 may be coupled to the transport vehicle (26-2) to hoist and lower the third carrier 16-2 in the upward and downward direction (the Z direction). The third hoist apparatus 66 may be coupled to lower portions of the transport vehicle body 22-1 and the additional transport vehicle body 23.

The third hoist apparatus 66 may clutch the third carrier 16-2, and may hoist and lower the third carrier 16-2 in the upward and downward direction (the Z direction). The third carrier 16-2 may include a third carrier body 12-2 having wafers mounted thereon, and a third carrier head 14-2 coupled to the third carrier body 12-2.

The third hoist apparatus 66 may include a third hand portion 62 that may be coupled to the transport vehicle body 22-1 and the additional transport vehicle body 23 and may be moved in the upward and downward direction (the Z direction). The third hoist apparatus 66 may include a third clutch portion 64 that may be coupled to the third hand portion 62 to clutch (or hold) the third carrier head 14-2 of the third carrier 16-2. The third hoist apparatus 66 may include a third hoisting and lowering driving line (not shown) capable of hoisting and lowering the third hand portion 62 and the third clutch portion 64 in the upward and downward direction (the Z direction).

The transport vehicle 26-2 may include a fourth hoist apparatus 72 that is located under the second carrier 56-1 and coupled to the transport vehicle body 22-1 and the additional transport vehicle body 23. The fourth hoist apparatus 72 may be coupled to the transport vehicle 26-2 to hoist and lower the fourth carrier 56-2 in the upward and downward direction (the Z direction). The fourth hoist apparatus 72 may be coupled to the lower portions of the transport vehicle body 22-1 and the additional transport vehicle body 23.

The fourth hoist apparatus 72 may clutch the fourth carrier 56-2, and may hoist and lower the fourth carrier 56-2 in the upward and downward direction (the Z direction). The fourth carrier 56-2 may include a fourth carrier body 52-2 having wafers mounted thereon, and a fourth carrier head 54-2 coupled to the fourth carrier body 52-2.

The fourth hoist apparatus 72 may include a fourth hand portion 68 that may be coupled to the transport vehicle body 22-1 and the additional transport vehicle body 23 and may be moved in the upward and downward direction (the Z direction). The fourth hoist apparatus 72 may include a fourth clutch portion 70 that may be coupled to the fourth hand portion 68 to clutch (or hold) the fourth carrier head 54-2 of the fourth carrier 56-2. The fourth hoist apparatus 72 may include a fourth hoisting and lowering driving line (not shown) capable of hoisting and lowering the fourth hand portion 68 and the fourth clutch portion 70 in the upward and downward direction (the Z direction).

Sliding covers 46-2a and 46-2c, which may be moved in the upward and downward direction (the Z direction), may be installed on the transport vehicle body 22-1. An additional sliding cover 46-2b, which may be moved in the upward and downward direction (the Z direction), may be installed on the additional transport vehicle body 23. A third anti-drop 74 for supporting a bottom portion of the third carrier 16-2 may be installed on the sliding cover 46-2a and the additional sliding cover 46-2b. A fourth anti-drop 76 for supporting a bottom portion of the fourth carrier 56-2 may be installed on the additional sliding cover 46-2b and the sliding cover 46-2c.

As described above, the transport vehicle 26-2 may include four carriers, i.e., the first carrier 16-1, the second carrier 56-1, the third carrier 16-2, and the fourth carrier 56-2. Accordingly, the transport vehicle 26-2 may more efficiently transport a larger number of materials for manufacturing a semiconductor device.

A transport apparatus of the disclosure may include a plurality of carriers, and hoist apparatuses capable of moving the plurality of carriers, to more efficiently transport a larger number of materials for manufacturing a semiconductor device.

Effects, which may be obtained from embodiments, are not limited to the above-mentioned effects, and other effects not mentioned may be clearly derived and understood from the following description by one of ordinary skill the art to which the embodiments belong.

Unintended effects according to the implementation of embodiments may also be derived by one of ordinary skill in the art from the embodiments.

Although various embodiments have been described above, the disclosure may be implemented by combining one or a plurality of embodiments. As described above, embodiments have been disclosed in the drawings and description. Although embodiments have been described by using particular terms in the description, the terms are used only for describing the spirit of the disclosure and are not used to limit the meaning or limit the scope of the disclosure defined by claims.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A transport apparatus comprising:
a transport vehicle configured to move along a traveling rail, and including a transport vehicle body; and
a hoist apparatus coupled to the transport vehicle, wherein the hoist apparatus includes: a first hoist apparatus coupled to the transport vehicle body, and capable of clutching a first carrier and hoisting and lowering the first carrier in upward and downward directions; and a second hoist apparatus coupled to the transport vehicle body and apart from the first hoist apparatus, and capable of clutching a second carrier and hoisting and lowering the second carrier in upward and downward directions,
wherein the first hoist apparatus is coupled to an upper portion of the transport vehicle body, and the second hoist apparatus is located apart from the first hoist apparatus in a downward direction and coupled to a lower portion of the transport vehicle body.

2. The transport apparatus of claim 1, wherein the first hoist apparatus is configured to move the first carrier in forward and backward directions.

3. The transport apparatus of claim 1, wherein the transport vehicle body further includes installed thereon a first anti-drop capable of supporting a bottom portion of the first carrier.

4. The transport apparatus of claim 1, wherein the transport vehicle body further includes installed thereon a sliding cover capable of being moved in upward and downward directions, and the sliding cover includes installed thereon a second anti-drop capable of supporting a bottom portion of the second carrier.

5. The transport apparatus of claim 1, wherein the first hoist apparatus includes a first hand portion coupled to an upper portion of the transport vehicle body and capable of being moved in upward and downward directions, a first clutch portion coupled to the first hand portion to clutch the first carrier, and a first hoisting and lowering driving line capable of hoisting and lowering the first hand portion and the first clutch portion in upward and downward directions, and the second hoist apparatus includes a second hand portion coupled to a lower portion of the transport vehicle body and capable of being moved in upward and downward directions, a second clutch portion coupled to the second hand portion to clutch the second carrier, and a second hoisting and lowering driving line capable of hoisting and lowering the second hand portion and the second clutch portion in upward and downward directions.

6. A transport apparatus comprising:
a transport vehicle configured to move along a traveling rail; and
a hoist apparatus coupled to the transport vehicle, wherein the transport vehicle includes a transport vehicle body connected to the traveling rail, the transport vehicle body has an internal space and an opening on a lower side thereof, and includes a sliding cover connected to the transport vehicle body and capable of being moved in upward and downward directions, and the hoist apparatus includes a first hoist apparatus coupled to the transport vehicle body, and capable of clutching a first carrier and hoisting and lowering the first carrier in upward and downward directions, and a second hoist apparatus coupled to the transport vehicle body and apart from the first hoist apparatus, and capable of clutching a second carrier and hoisting and lowering the second carrier in upward and downward directions
wherein the first hoist apparatus is coupled to an upper portion of the transport vehicle body, and the second hoist apparatus is located apart from the first hoist apparatus in a downward direction and coupled to a lower portion of the transport vehicle body.

7. The transport apparatus of claim 6, wherein the first hoist apparatus is configured to move the first carrier in forward and backward directions and upward and downward directions, the first hoist apparatus and the first carrier are configured to move in forward and backward directions through the internal space, and the first hoist apparatus and the first carrier are configured to move in upward and downward directions through the opening.

8. The transport apparatus of claim 6, wherein the first hoist apparatus includes a first hand portion coupled to an upper portion of the transport vehicle body and capable of being moved in forward and backward directions and upward and downward directions, a first clutch portion coupled to the first hand portion to clutch the first carrier, and a first hoisting and lowering driving line capable of hoisting and lowering the first hand portion and the first clutch portion in upward and downward directions, and the second hoist apparatus includes a second hand portion coupled to a lower portion of the transport vehicle body and capable of being moved in forward and backward directions and upward and downward directions, a second clutch portion coupled to the second hand portion to clutch the second carrier, and a second hoisting and lowering driving line capable of hoisting and lowering the second hand portion and the second clutch portion in upward and downward directions.

9. The transport apparatus of claim 6, wherein the transport vehicle body further includes installed thereon a first anti-drop capable of supporting a bottom portion of the first carrier, and the sliding cover further includes installed thereon a second anti-drop capable of supporting a bottom portion of the second carrier.

10. A transport apparatus comprising:
a transport vehicle configured to move along a traveling rail; and
a hoist apparatus coupled to the transport vehicle, wherein the transport vehicle includes a transport vehicle body connected to the traveling rail, the transport vehicle body has an internal space and an opening on a lower side thereof, and includes a sliding cover connected to the transport vehicle body and capable of being moved in upward and downward directions, and the hoist apparatus includes a first hoist apparatus coupled to the transport vehicle body, and capable of clutching a first carrier and hoisting and lowering the first carrier in upward and downward directions, and a second hoist apparatus coupled to the transport vehicle body and apart from the first hoist apparatus, and capable of clutching a second carrier and hoisting and lowering the second carrier in upward and downward directions, wherein the first hoist apparatus is coupled to an upper portion of the transport vehicle body, and the second hoist apparatus is coupled to the upper portion of the transport vehicle body and apart from the first hoist apparatus in a left direction or a right direction, a third hoist apparatus located apart from the first hoist apparatus in a downward direction, and capable of clutching a third carrier and hoisting and lowering the third carrier in upward and downward directions; and a fourth hoist apparatus located apart from the second hoist apparatus in a downward direction, and capable of clutching a fourth carrier and hoisting and lowering the fourth carrier in upward and downward directions.

11. The transport apparatus of claim 10, wherein the first hoist apparatus is configured to move the first carrier in forward and backward directions, and the second hoist apparatus is configured to move the second carrier in forward and backward directions.

* * * * *